(12) United States Patent
Shen

(10) Patent No.: US 12,355,161 B2
(45) Date of Patent: Jul. 8, 2025

(54) ANTENNA INTERFERENCE PREVENTION METHOD, COMMUNICATION DEVICE AND STORAGE MEDIUM

(71) Applicant: ZTE CORPORATION, Shenzhen (CN)

(72) Inventor: Shaowu Shen, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 216 days.

(21) Appl. No.: 18/247,146

(22) PCT Filed: Aug. 5, 2021

(86) PCT No.: PCT/CN2021/110923
§ 371 (c)(1),
(2) Date: Mar. 29, 2023

(87) PCT Pub. No.: WO2022/078031
PCT Pub. Date: Apr. 21, 2022

(65) Prior Publication Data
US 2023/0369757 A1 Nov. 16, 2023

(30) Foreign Application Priority Data
Oct. 13, 2020 (CN) .......................... 202011090081.0

(51) Int. Cl.
*H01Q 3/02* (2006.01)
*G01R 29/08* (2006.01)
(Continued)

(52) U.S. Cl.
CPC .......... *H01Q 3/02* (2013.01); *G01R 29/0892* (2013.01); *H01Q 1/2266* (2013.01); *H01Q 1/523* (2013.01)

(58) Field of Classification Search
USPC ........................................................ 343/702
See application file for complete search history.

(56) References Cited

U.S. PATENT DOCUMENTS 8,792,444 B2 * 7/2014 Ishida .................... H01Q 1/246
455/562.1
10,498,029 B1 * 12/2019 Tran .................... F21V 33/0052
(Continued)

FOREIGN PATENT DOCUMENTS

| CN | 107611612 A | 1/2018 | |
| CN | 110035149 A * | 7/2019 | ........... H04B 7/0404 |

(Continued)

OTHER PUBLICATIONS

European Patent Office. Partial Supplementary European Search Report for EP Application No. 21879078.0, mailed Jan. 26, 2024, pp. 1-11.
(Continued)

*Primary Examiner* — Dimary S Lopez Cruz
*Assistant Examiner* — Brandon Sean Woods
(74) *Attorney, Agent, or Firm* — Vivacqua Crane, PLLC

(57) ABSTRACT

Disclosed are an antenna anti-interference method, a communication device, and a storage medium. The antenna anti-interference method may include: detecting performance parameters of a single antenna and a combination of antennas in an antenna sequence group of a communication device, the antenna sequence group comprises a group of antennas simultaneously operating in different antenna roles, and corresponding antenna sequence groups are different in response to any one of the antennas or the antenna roles being different; determining, according to the performance parameters, an antenna to be adjusted from the antenna sequence group; adjusting the antenna to be adjusted to reduce interference on the antenna sequence group; and controlling operation of an adjusted antenna sequence group.

10 Claims, 5 Drawing Sheets

(51) Int. Cl.
*H01Q 1/22* (2006.01)
*H01Q 1/52* (2006.01)

(56) References Cited

U.S. PATENT DOCUMENTS

2011/0249760 A1   10/2011  Chrisikos et al.
2019/0020119 A1*  1/2019  Laxminarayana ... H04B 7/2041

FOREIGN PATENT DOCUMENTS

| CN | 110098486 A |   | 8/2019  |           |
|----|-------------|---|---------|-----------|
| CN | 110113459 A | * | 8/2019  | H04B 7/0413 |
| CN | 111029772 A |   | 4/2020  |           |
| WO | 2019184636  |   | 10/2019 |           |

OTHER PUBLICATIONS

The State Intellectual Property Office of People's Republic of China. First Office Action for CN Application No. 202011090081.0 and English translation, mailed Sep. 20, 2024, pp. 1-14.
The State Intellectual Property Office of People's Republic of China. First Search Report for CN Application No. 202011090081.0 and English translation, mailed Sep. 16, 2024, pp. 1-4.
International Searching Authority. International Search Report and Written Opinion for PCT Application No. PCT/CN2021/110923 and English translation, mailed Oct. 28, 2021, pp. 1-11.

* cited by examiner

US 12,355,161 B2

ANTENNA INTERFERENCE PREVENTION METHOD, COMMUNICATION DEVICE AND STORAGE MEDIUM

CROSS-REFERENCE TO RELATED APPLICATION

This application is a national stage filing under 35 U.S.C. § 371 of international application number PCT/CN2021/110923, filed Aug. 5, 2021, which claims priority to Chinese patent application No. 202011090081.0, filed Oct. 13, 2020. The contents of these applications are incorporated herein by reference in their entirety.

TECHNICAL FIELD

Embodiments of the present disclosure relate to, but not limited to, the technical field of communication, and more particularly to, but not limited to, an antenna anti-interference method, a communication device, and a storage medium.

BACKGROUND

The resources that can be obtained by a terminal and the maximum download rate generally depend on the efficiency and communication quality of a terminal antenna. For example, if there is a poor orthogonality between the terminal antenna and a base station antenna, poor orthogonality between operating antennas of the terminal or antenna interference, the base station will give a poor channel quality evaluation result for the terminal, thus providing fewer scheduling resources for the terminal, which will affect the throughput of terminal and limit the user experience.

SUMMARY

An antenna anti-interference method, a communication device and a storage medium are provided by embodiments of the present disclosure to solve, at least to a certain extent, the technical problems that the throughput of the terminal is affected and the user experience is reduced when antenna efficiency and communication quality of the terminal are poor.

In view of the above, an embodiment of the present disclosure provides an antenna anti-interference method. The method may include: detecting performance parameters of a single antenna and a combination of antennas in an antenna sequence group of a communication device, where the antenna sequence group comprises a group of antennas simultaneously operating in different antenna roles, and corresponding antenna sequence groups are different in response to any one of the antennas or the antenna roles being different; determining, according to the performance parameters, an antenna to be adjusted from the antenna sequence group; adjusting the antenna to be adjusted to reduce interference on the antenna sequence group; and controlling operation of an adjusted antenna sequence group.

An embodiment of the present disclosure further provides a communication device. The communication device may include a processor, a memory and a communication bus, and the communication device may further include a plurality of antennas. The communication bus is configured to implement connection communication between the processor and the memory; and the processor is configured to execute one or more programs stored in the memory to implement the antenna anti-interference method.

An embodiment of the present disclosure further provides a computer storage medium, storing at least one of antenna anti-interference programs which, when executed by one or more processor, causes the one or more processor to implement the antenna anti-interference method.

An embodiment of the present disclosure further provides a communication device. The communication device may include a plurality of antennas distributed on at least two planes parallel to a display screen of the communication device.

Other features and corresponding beneficial effects of the present disclosure are set forth later in the description, and it should be understood that at least some of the beneficial effects will become apparent from the record of the description of the present disclosure.

DETAILED DESCRIPTION

Figure 1:
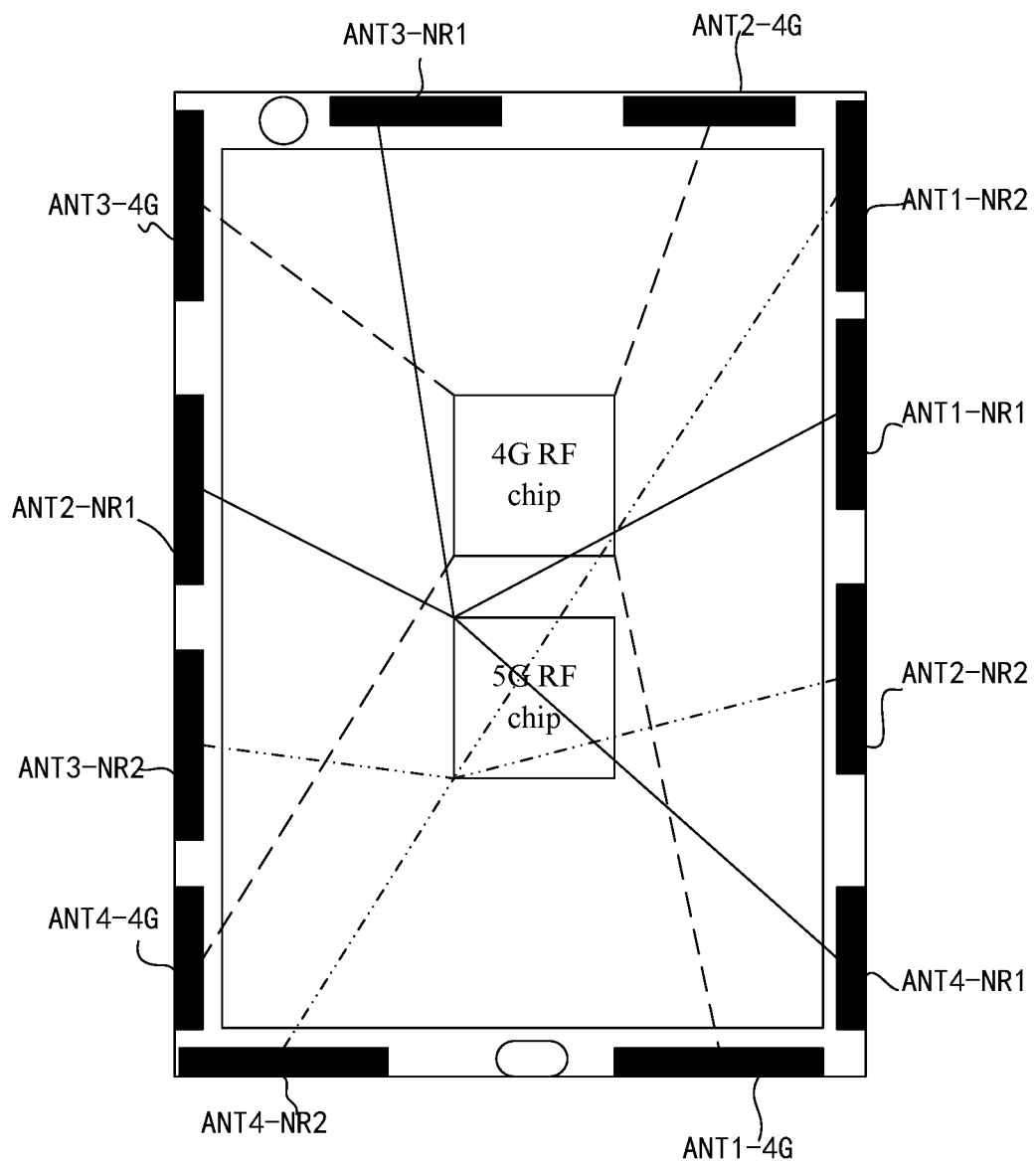
FIG. 1 is a schematic diagram of distribution of antennas of a 5G communication device shown in Embodiment one of the present disclosure.

To make the objectives, technical schemes and advantages of the present disclosure clear, the embodiments of the present disclosure will be described in further detail by way of implementations in conjunction with the accompanying drawings. It is to be understood that the embodiments described herein are only used to illustrate the present disclosure, and are not intended to limit the present disclosure.

Embodiment One

Currently, a New Radio (NR) part of a 5G communication device generally adopts 4*4 Multiple-in Multiple-out (MIMO) antennas. Six antennas may operate simultaneously in the case of Non-Standalone (NSA); and four antennas may operate simultaneously in the case of Standalone (SA). If there is interference or mutual interference between these antennas, Over the Air (OTA) performance of the communication device will be affected, and the base station will give a poor channel quality evaluation result for the antennas, such that fewer scheduling resources will be given for the communication device. In addition, under weak signals, due to the low signal strength received by the communication device, a Signal Noise Ratio (SNR) value is generally low, and the maximum downlink throughput resources allocated by the base station to the communication device will be small, resulting in a low Internet access rate of users.

With the development and evolution of communication technologies, there are more and more communication systems and communication frequency bands. For example, the communication device is generally compatible with cellular low, medium and high frequencies, and even ultrahigh frequency (UHF). In addition, there are Wireless Fidelity (WIFI) communication frequency band, Bluetooth communication frequency band, and Global Positioning System (GPS) communication frequency band, etc. Currently, in a 5G communication system, SUB6 GHZ (FR1 frequency band with a frequency range of 450 MHZ to 6 GHZ) and MMW (mmWave, millimeter wave, also known as FR2 frequency band with a frequency range of 24.25 GHZ to 52.6 GHZ) are added. In terms of the communication standards, the communication device may be compatible with requirements of 2G, 3G, 4G and 5G, and cover a frequency band of 600 MHZ to 60 GHZ in. Moreover, to pursue higher data transmission rate, the communication device also may need to support MIMO multi-antenna and Carrier Aggregation (CA) technologies.

Currently, because RF processing units and transceiver links of 4G and 5G are independent of each other, the two groups of links may simultaneously operate when a signal comes out from an RF transceiver to a front end of an antenna. That is, when 4G is transmitting a signal, 5G may be receiving the signal; and when 5G is transmitting a signal, 4G may be receiving the signal. This situation is particularly obvious in the frequency bands with a harmonic relationship, such as coexistence of Sub6 GHz, coexistence of B3 frequency band and N78 frequency band, and coexistence of B41 frequency band and N41 frequency band in 4G and 5G. In addition to the coexistence of frequency bands between 4G and 5G, there will also be interference problem of coexistence between 5G cellular communication frequency band and WiFi communication frequency band, and between Bluetooth communication frequency band and GPS communication frequency band, for example, the coexistence of WiFi 5G and Sub6 N79, and for another example, the coexistence of Sub6 GHz and Global Navigation Satellite System (GNSS), and the coexistence of millimeter wave and GPS, etc. In the scenario of EUTRA-NR Dual Connectivity (ENDC, which means dual connectivity between other wireless protocols and NR 5G), because NR has a wide frequency band coverage, Time Division Duplexing (TDD) NR frequency band alone includes 3.3 GHZ to 40 GHZ. If Frequency Division Duplexing (FDD) NR frequency band of Framing is included, the NR frequency band will cover 650 MHZ to 40 GHZ. These frequency bands coincide with the traditional 2G, 3G, 4G, Bluetooth, WiFi and GPS frequency bands, and most of which may operate simultaneously.

Referring to a schematic diagram of distribution of antennas of a 5G communication device shown in FIG. 1, the 5G communication device has more than 10 antennas and more than 30 frequency bands, each frequency band (such as B1 frequency band) is divided into four channels, i.e., a main channel, a diversity channel, a main MIMO channel, and a diversity MIMO channel. Each channel may be divided into a plurality of branch paths due to different physical devices. Due to an increase in RF channels and paths, routing and layout of each channel should not only meet certain compatibility requirements, but also meet certain isolation requirements, which has become a problem for a printed circuit board (PCB) with limited area. Moreover, under ENDC, harmonic and intermodulation influences between LTE and NR frequency bands are very large. A wrong selection of path may lead to poor isolation, and the sensitivity of LTE and NR will inevitably deteriorate, which will affect the communication performance of the communication device and directly affect the throughput and user experience. In FIG. 1, "ANTN-X" denotes an N-th antenna in an X frequency band, for example, "ANT1-NR1" denotes a first antenna in an NR1 frequency band, "ANT2-NR1" denotes a second antenna in the NR1 frequency band, "ANT3-NR1" denotes a third antenna in the NR1 frequency band, and "ANT4-NR1" denotes a fourth antenna in the NR1 frequency band; "ANT1-NR2" denotes a first antenna in an NR2 frequency band, "ANT2-NR2" denotes a second antenna in the NR2 frequency band, "ANT3-NR2" denotes a third antenna in the NR2 frequency band, and "ANT4-NR2" denotes a fourth antenna in the NR2 frequency band; "ANT1-4G" denotes a first antenna in a 4G frequency band, "ANT2-4G" denotes a second antenna in the 4G frequency band, "ANT3-4G" denotes a third antenna in the 4G frequency band, and "ANT4-4G" denotes a fourth antenna in the 4G frequency band.

With the increase in number of the antennas in the communication device, the efficiency allocation of each antenna becomes lower. For a certain frequency band (such as N41 frequency band), layout of four MIMO antennas is reasonable, but for another NR frequency band (such as N78 frequency band), the relative position layout of four MIMO antennas is less reasonable. Meanwhile, during the use of the communication device (such as a mobile phone), with the change of a position of the communication device, a direction of a user using the communication device is changed, a position of the communication device with respect to a base station is changed, an orthogonal relationship between the antennas of the communication device is changed, and the throughput of the communication device will accordingly be affected.

Figure 2:
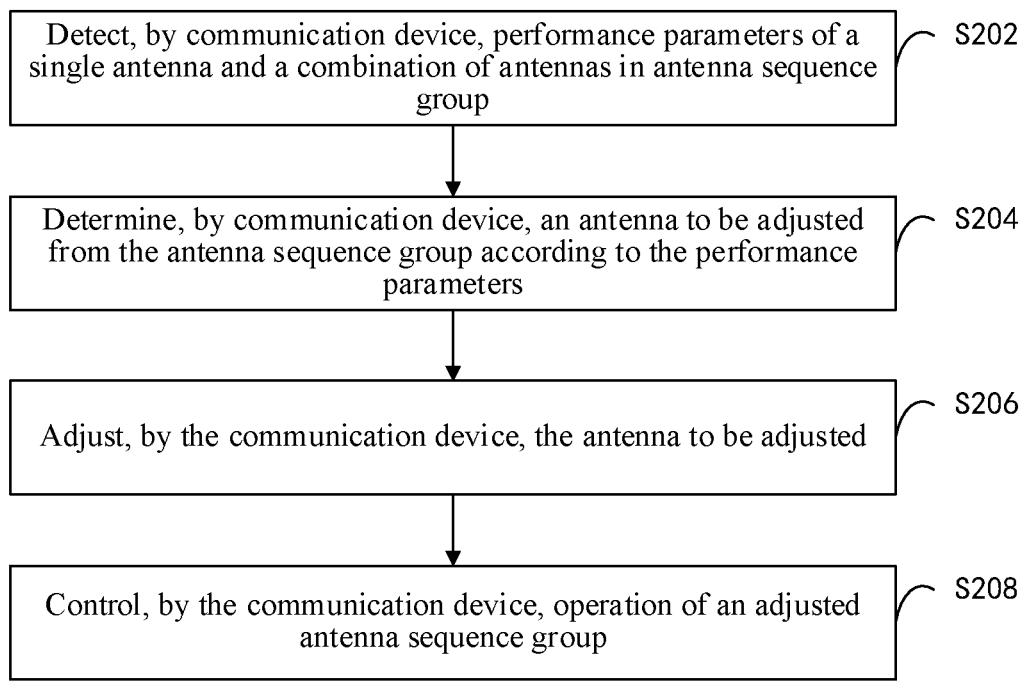
FIG. 2 is a flowchart of an antenna anti-interference method provided in Embodiment one of the present disclosure.

In view of the problem that the antenna efficiency and communication quality of the communication device of a user affect the throughput and lead to poor user communication experience, this embodiment provides an antenna anti-interference method, and reference may be made to the flowchart of the antenna anti-interference method shown in FIG. 2. The method includes the following steps of S202 to S208.

At S202, the communication device detects performance parameters of a single antenna and a combination of antennas in an antenna sequence group.

The antenna sequence group comprises a group of antennas in the communication device simultaneously operating in different antenna roles. Moreover, two antenna sequence groups with different antenna members are different, and two antenna sequence groups with the same antenna members but different antenna roles are also different. For example, in an example, a first antenna sequence group includes four antennas a, b, c and d, and a second antenna sequence group includes four antennas a, b, c and e. Since the antenna members of the two antenna sequence groups are different, the first antenna sequence group is different from the second antenna sequence group. Assuming that a third antenna sequence group also includes four antennas a, b, c and d, with antenna a serving as a main antenna, antenna b serving as a diversity antenna, and antenna c and the antenna d serving as MIMO antennas. However, in the first antenna sequence group, the antenna b is a main antenna, the antenna a is a diversity antenna, and the antenna c and the antenna d are MIMO antennas. Therefore, although the antenna members of the first antenna sequence group and the second antenna sequence group are the same, the antenna roles of these antennas are different, so that the first antenna sequence group and the third antenna sequence group are different antenna sequence groups.

When the communication device detects the performance parameters of a single antenna and a combination of antennas in an antenna sequence group, the communication device may detect the performance parameters of a single antenna, and may also detect the performance parameters of a combination of two or even more antennas in this antenna sequence group. It is to be understood that the performance parameters of a single antenna refer to performance parameters when only one antenna is in an operating state. The performance parameters of a combination of antennas refer to overall performance parameters when two or more antennas operate simultaneously. For example, for an antenna sequence group including four antennas a, b, c and d, the communication device may detect performance parameters of the four antennas a, b, c and d, respectively. In addition, the communication device may also detect performance parameters of a combination of the antenna a and the antenna b, performance parameters of a combination of the antenna a and the antenna c, performance parameters of a combination of the antenna a and the antenna d, and the like.

For example, currently an N41 frequency band has four signal paths, i.e., TRX, DRX, PRX-MIMO, and DRX-MIMO. In other words, for the N41 frequency band, the antenna sequence group of the communication device includes four antenna roles, i.e., TRX, DRX, PRX-MIMO, and DRX-MIMO. The communication device may define 15 instructions from C1 to C15, and these 15 instructions are respectively configured for detecting the performance parameters of different antennas or different combinations of antennas. For example, the instruction C1 is configured for controlling the communication device to enter a DRX-MIMO only (i.e., only a DRX-MIMO antenna is operating) mode, the instruction C2 is configured for controlling the communication device to enter a PRX-MIMO only (i.e. only a PRX-MIMO antenna is operating) mode, the instruction C3 is configured for controlling the communication device to enter a PRX-MIMO, DRX-MIMO only (i.e. only the PRX-MIMO antenna and the DRX-MIMO antenna are operating) mode . . . , and the instruction C8 is configured for controlling the communication device to enter a TRX ONLY (i.e. only a TRX antenna is operating) mode, which is shown in Table 1 in detail. In Table 1, "1" indicates that an antenna is operating, and "0" indicates that the antenna is not operating.

TABLE 1

| Instructions | TRX antenna | DRX antenna | PRX-MIMO antenna | DRX-MIMO antenna |
| --- | --- | --- | --- | --- |
| C1 | 0 | 0 | 0 | 1 |
| C2 | 0 | 0 | 1 | 0 |
| C3 | 0 | 0 | 1 | 1 |
| C4 | 0 | 1 | 0 | 0 |
| C5 | 0 | 1 | 0 | 1 |
| C6 | 0 | 1 | 1 | 0 |
| C7 | 0 | 1 | 1 | 1 |
| C8 | 1 | 0 | 0 | 0 |
| C9 | 1 | 0 | 0 | 1 |
| C10 | 1 | 0 | 1 | 0 |
| C11 | 1 | 0 | 1 | 1 |
| C12 | 1 | 1 | 0 | 0 |

TABLE 1-continued

| Instructions | TRX antenna | DRX antenna | PRX-MIMO antenna | DRX-MIMO antenna |
| --- | --- | --- | --- | --- |
| C13 | 1 | 1 | 0 | 1 |
| C14 | 1 | 1 | 1 | 0 |
| C15 | 1 | 1 | 1 | 1 |

In this embodiment, when detecting the performance parameters of a single antenna and a combination of antennas in an antenna sequence group, the communication device may detect parameters that can directly reflect antenna performance, for example, signal strength such as a Reference Signal Received Power (RSRP) value, a Received Signal Strength Indicator (RSSI) value, efficiency and gain of an antenna, directivity or standing wave ratio, correlation coefficient or isolation, etc. The communication device may also detect parameters that indirectly reflect antenna performance, such as a Signal-to-Noise Ratio (SNR) value, a Channel Quality Indicator (CQI) value, MIMO RANK (Rank) signal flow number, Modulation and Coding Scheme (MCS) mode and order, or throughput rate, bit error rate, etc. In some examples of this embodiment, the performance parameters detected by the communication device include, but not limited to, a combination of one or more of an RSRP, an RSSI, an antenna efficiency, an antenna gain, an antenna direction parameter, an antenna standing wave ratio parameter, an antenna isolation, an SNR, a CQI, throughput, a bit error rate, an MCS, or Rank flow number.

At S204, the communication device determines an antenna to be adjusted from the antenna sequence group according to the performance parameters.

After detecting the performance parameters corresponding to the antenna sequence group, the communication device may determine the antenna to be adjusted from the antenna sequence group according to the performance parameters. It is to be understood that the antenna to be adjusted in the antenna sequence group may be an antenna seriously interfered or an antenna causing serious interference to other antennas; and the antenna to be adjusted may be an antenna having poor orthogonality with other antennas or an antenna having poor orthogonality with a base station antenna.

In some examples of this embodiment, the communication device may determine an interfered antenna as the antenna to be adjusted according to the detected performance parameters in combination with coordinate positions of each antenna in the antenna sequence group. In some examples, the communication device may select the most seriously interfered antenna as the antenna to be adjusted, or the communication device may select all antennas with the interference degree meeting requirements as antennas to be adjusted. In some examples, the coordinate positions of each antenna may be stored and recorded in advance in the communication device, such that when determining the antenna to be adjusted, the communication device may directly determine antennas seriously interfered according to a detection result of the performance parameters in combination with the coordinate positions of each antenna stored in advance.

Figure 3:
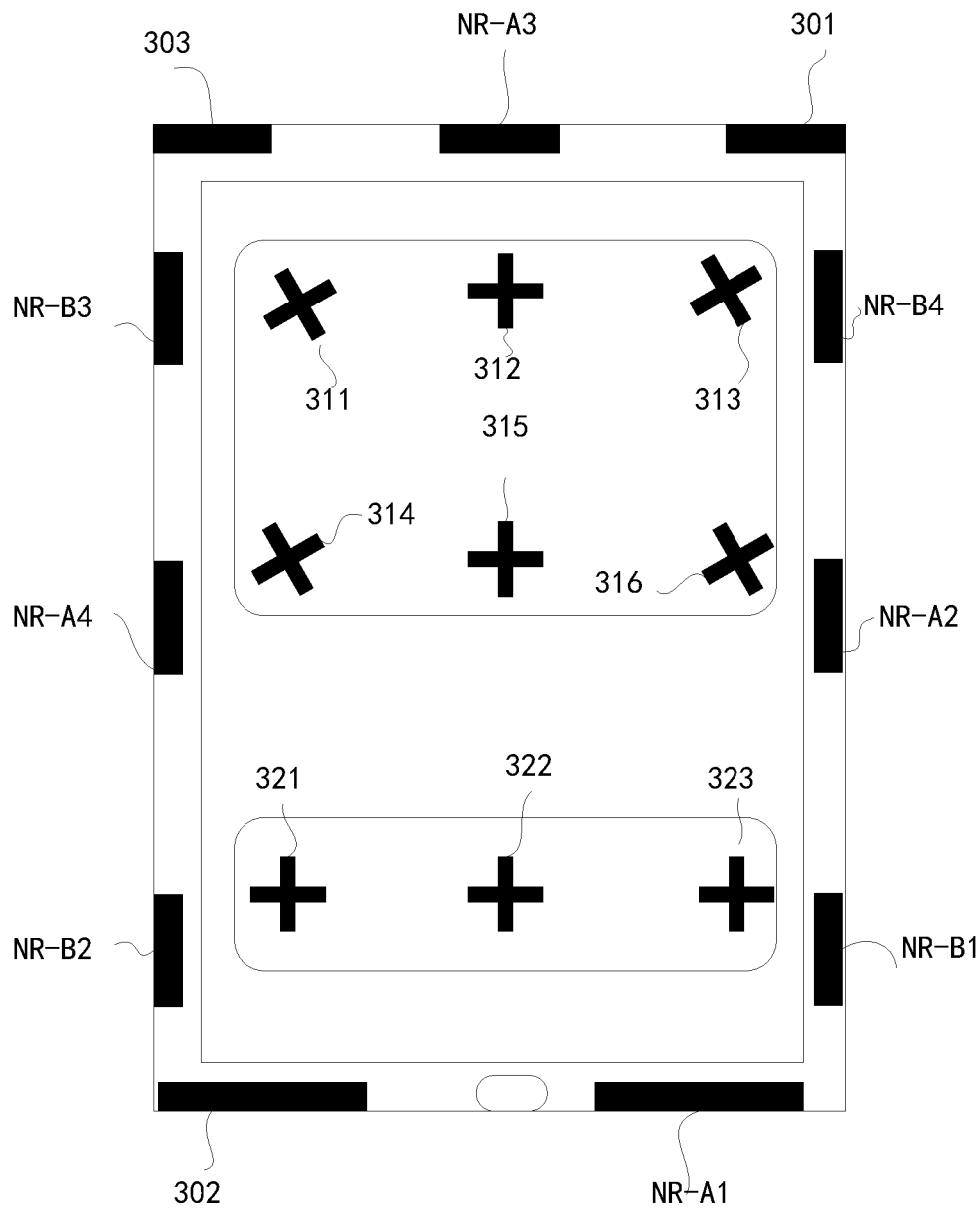
FIG. 3 is a schematic diagram of a layout of antennas in a communication device shown in Embodiment one of the present disclosure.

The coordinate position of an antenna refers to position of the antenna in the communication device. For example, it is assumed that the coordinate position of each antenna is determined using a lower left corner of the communication device (it is to be understood that the lower left corner is only an example, and it may also be a lower right corner or a central position of the communication device) as a coordinate origin. In some examples, the antennas in the communication device are arranged in a two-dimensional layout. That is, all the antennas may basically be regarded as being on the same plane. For example, in some mobile phones, the antennas are distributed on upper and lower clearance areas of a rear shell and a surrounding bezel of a mobile phone, and the communication device only records the two-dimensional coordinate position when storing the coordinate position of each antenna. In some other examples of this embodiment, the antennas of the communication device may be arranged in a three-dimensional layout. For example, in the communication device, in addition to the clearance areas and the surrounding bezel, the antennas may also be deployed on a main board and a daughter board of the communication device. For example, FIG. 3 shows a layout of antennas in a communication device. When the antennas in the communication device are arranged in a three-dimensional layout, the coordinate position of each antenna recorded and stored in advance in the communication device is also a three-dimensional coordinate position. It should be understood that in FIG. 3, some antennas are arranged on a main board 31 of the communication device, such as a first NR orthogonal antenna 311, a second NR orthogonal antenna 312, a third NR orthogonal antenna 313, a fourth NR orthogonal antenna 314, a fifth NR orthogonal antenna 315, and a sixth NR orthogonal antenna 316; some antennas are arranged on a daughter board 32 of the communication device, for example, a seventh NR orthogonal antenna 321, an eighth NR orthogonal antenna 322, and a ninth NR orthogonal antenna 323; and some antennas are arranged on the clearance areas of the rear shell and the surrounding bezel, such as an NR antenna sequence group A (NR-A1, NR-A2, NR-A3 and NR-A4), an NR antenna sequence group B (NR-B1, NR-B2, NR-B3 and NR-B4), a first LTE antenna 301, a second LTE antenna 302, and a WiFi GPS antenna 303. However, in some other examples of this embodiment, the antennas may be provided only on the clearance areas, the bezel and the main board, or the antennas may be provided only on the daughter board and the clearance areas, or the antennas may be distributed only on the bezel and the main board.

It is to be understood that interference sources causing interference to the antennas in the antenna sequence group may be any one of other antennas in the antenna sequence group, electronics in the communication device, body parts of a user of the communication device or other external electronics, base stations, and the like.

In some other examples of this embodiment, the communication device may determine an antenna causing interference to other antennas in the antenna sequence group as the antenna to be adjusted according to the detected performance parameters and the coordinate positions of the antennas in the antenna sequence group. For example, the communication device may select, according to the performance parameters and the coordinate positions, one antenna causing the most serious interference to the other antennas in the antenna sequence group as the antenna to be adjusted, or the communication device may also select all antennas causing interference to the other antennas that meet requirements as antennas to be adjusted. In addition, if the antennas of the communication device are arranged in a two-dimensional layout, the communication device stores a two-dimensional coordinate position of each antenna in advance; and if the antennas of the communication device are arranged in a three-dimensional layout, the communication device stores a three-dimensional coordinate position of each antenna in advance.

In some other examples, the communication device may determine an antenna with orthogonality not meeting the requirement as the antenna to be adjusted according to the detected performance parameters of the antenna sequence group. It is to be understood that orthogonality not meeting the requirement includes at least one of the following two cases.

In a first case, the antenna in the antenna sequence group is orthogonally mismatched with the base station antenna.

In a second case, the antenna in the antenna sequence group is orthogonally mismatched with the other antennas in the antenna sequence group.

In some examples, the communication device may determine an antenna orthogonally mismatched with other antennas in the antenna sequence group as the antenna to be adjusted according to the performance parameters and the coordinate position of each antenna in the antenna sequence group. The communication device may also determine, from the antenna sequence group, an antenna orthogonally mismatched with a base station antenna as the antenna to be adjusted according to the detected performance parameters.

It is to be understood that, generally the antennas in the communication device are omnidirectional antennas. In this case, the communication device may do not need to rely on a radiation direction of each antenna when determining an antenna seriously interfered, or an antenna causing serious interferences to other antennas, or an antenna with orthogonality not meeting the requirement as the antenna to be adjusted. However, if the antennas in the communication device include directional antennas, the communication device may further take the radiation direction of each antenna into consideration in addition to the coordinate position of each antenna when determining the antenna to be adjusted. In these examples, the communication device may further store the radiation direction of each antenna in addition to the coordinate position of each antenna in advance.

It should be understood that, the communication device does not always have to determine the antenna to be adjusted according to the detected performance parameters, and then adjust the antenna to be adjusted. For example, in some examples, if the performance parameters detected by the communication device indicate that each antenna in the antenna sequence group has good orthogonality and high isolation, is orthogonal to the base station antenna, and is basically not interfered by the interference sources, the overall performance of the antennas is excellent. In this case, the communication device may do not need to adjust the antenna sequence group, and thus may do not need to select an antenna to be adjusted from the antenna sequence group. Therefore, in some examples, the communication device may first determine whether the performance parameters corresponding to the antenna sequence group meet service requirements of the communication device before determining the antenna to be adjusted from the antenna sequence group according to the detected performance parameters, if yes, the communication device will not adjust the antenna sequence group temporarily. However, if the communication device determines that the service requirements of the communication device is not met according to the detected performance parameters, the communication device determines the antenna to be adjusted from the antenna sequence group in the way as described in the foregoing examples.

At S206, the communication device adjusts the antenna to be adjusted.

After determining the antenna to be adjusted from the antenna sequence group, the communication device adjusts the antenna to be adjusted. By adjusting the antenna to be adjusted, the interference experienced by the antenna sequence group is reduced, and the overall performance of the antenna sequence group is improved. One antenna sequence group may include one antenna to be adjusted, or may also include two or more antennas to be adjusted.

In this embodiment, number of the antennas to be adjusted in the antenna sequence group is not limited. For example, in an example, all antennas in one antenna sequence group may be antennas to be adjusted.

It is to be understood that the antenna to be adjusted may be adjusted in any of the following two modes.

Figure 4:
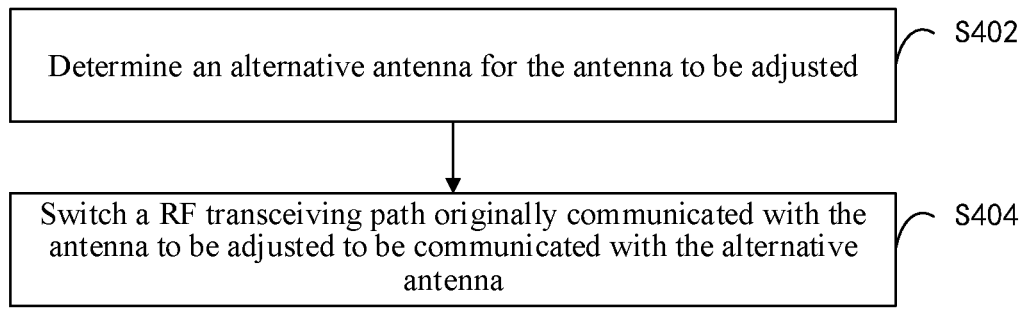
FIG. 4 is a flowchart of adjusting an antenna to be adjusted provided in Embodiment one of the present disclosure.

In mode one, the antenna to be adjusted is directly replaced. Referring to FIG. 4, a flowchart for adjusting the antenna to be adjusted is shown.

At S402, an alternative antenna is determined for the antenna to be adjusted.

In this scheme of adjusting the antenna to be adjusted, after the communication device determines the antenna to be adjusted, it is also required to determine an alternative antenna of the antenna to be adjusted. It should be understood that, if the antenna to be adjusted is an antenna that has great interference with the other antennas in the antenna sequence group, the alternative antenna corresponding to the antenna to be adjusted should be an antenna with basically no interference or relatively small interference to the other antennas in the antenna sequence group. In addition, the orthogonality between the antenna to be adjusted and the other antennas in the antenna sequence group and the orthogonality between the antenna to be adjusted and the base station antenna should also meet the requirements. Otherwise, after the antenna to be adjusted in the antenna sequence group is replaced by alternative antenna, the alternative antenna may have an adverse effect on the performance of the antenna sequence group due to orthogonal mismatch. If the antenna to be adjusted is an antenna seriously affected by an interference source, the alternative antenna should be basically unaffected by the interference source, and simultaneously should meet the orthogonality requirements. If the antenna to be adjusted is an antenna that is orthogonally mismatched with the other antennas in the antenna sequence group, the alternative antenna should be an antenna that is basically orthogonal to the antennas in the antenna sequence group, and the orthogonality between the alternative antenna and the base station antenna also meets the requirements. In addition, the alternative antenna is basically not interfered and has basically no interference to the other antennas.

In some examples, when the communication device determines an alternative antenna for an antenna to be adjusted, the determination may be made based on at least one of the performance parameters or coordinate position of each antenna in the communication device. It should be understood that, in a scheme of determining an alternative antenna according to the performance parameters of each antenna, when detecting the performance parameters, the communication device may not only to detect the performance parameters of a single antenna and a combination of antennas in the antenna sequence group, but also to detect the performance parameters of other antennas not included in the antenna sequence group, and the performance parameters of a combination of antennas in the antenna sequence group and antennas not included in the antenna sequence group. In some examples of this embodiment, the communication device may determine the alternative antenna of the antenna to be adjusted based only on the performance parameters of each antenna. In another example of this embodiment, the communication device may determine the alternative antenna based on the coordinate position of each antenna. In some other examples, the communication device may determine the alternative antenna according to the performance parameters and the coordinate position of each antenna. In addition, if the antennas in the communication device are directional antennas, the communication device may also determine the alternative antenna according to a radiation direction of each antenna.

At S404, a radio frequency (RF) transceiving path originally communicated with the antenna to be adjusted is switched to be communicated with the alternative antenna.

Figure 5:
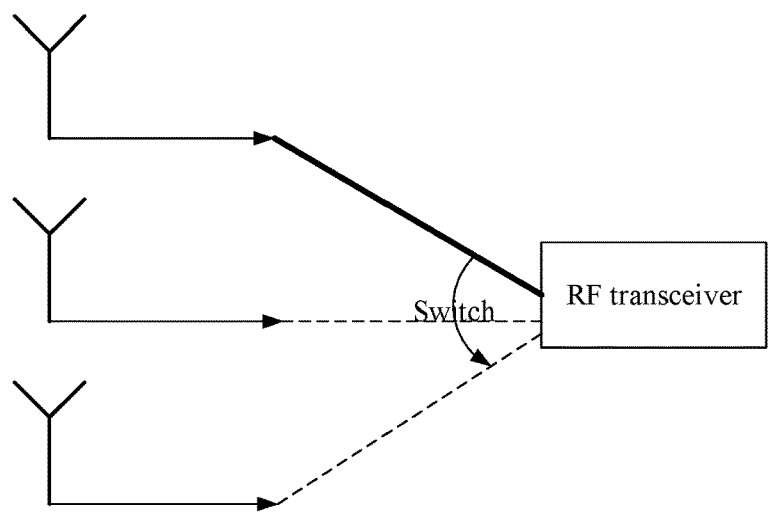
FIG. 5 is a schematic diagram of switching antennas provided in Embodiment one of the present disclosure.

After determining the alternative antenna for the antenna to be adjusted, the communication device may disconnect the antenna to be adjusted from the corresponding RF transceiving path, and connect the RF transceiving path to the alternative antenna, thus ensuring that the RF transceiving path can use the alternative antenna to complete signal transceiving in the subsequent process, as shown in FIG. 5.

In mode two, a radiation angle of the antenna to be adjusted is adjusted.

Figure 6:
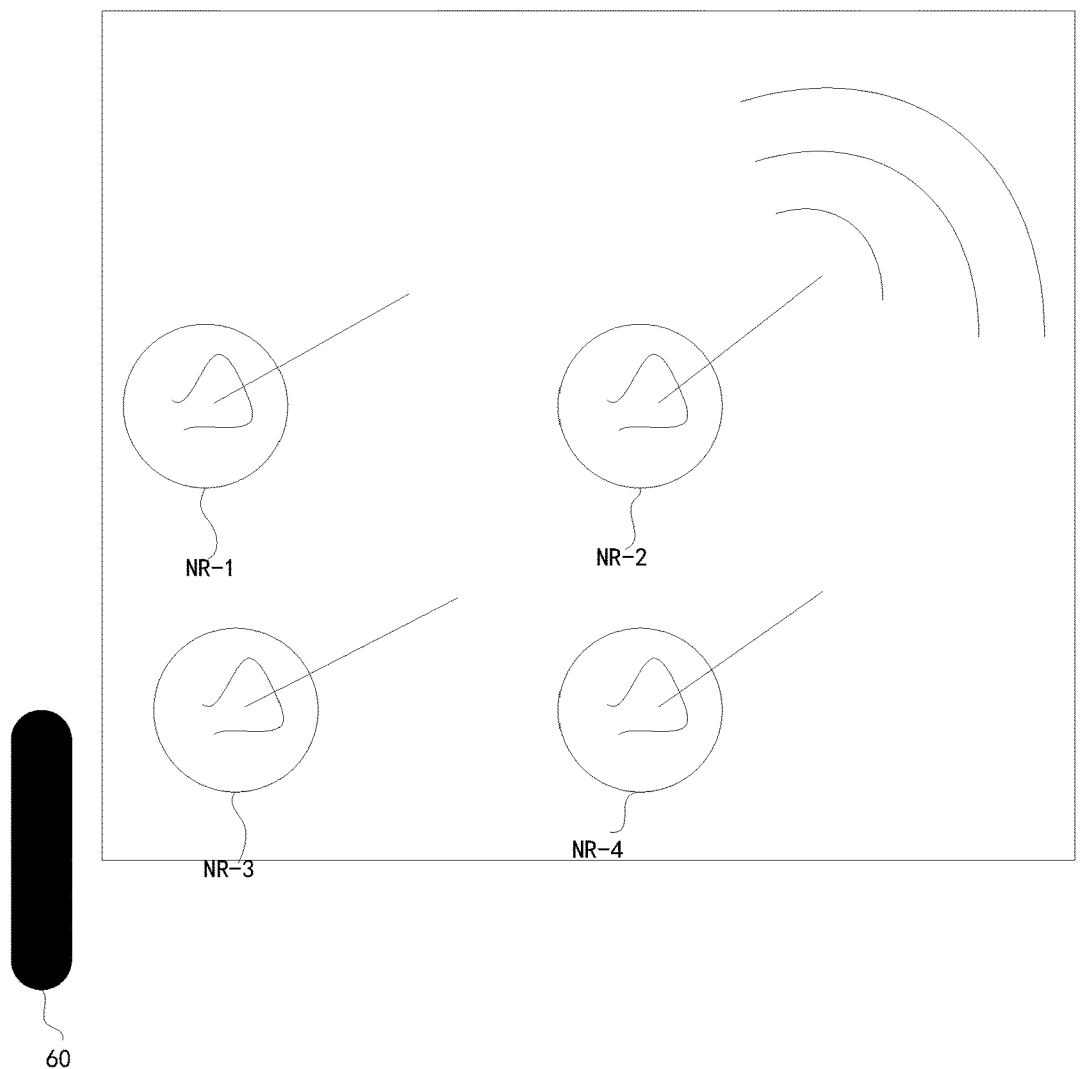
FIG. 6 is a schematic diagram of an anti-directional interference source provided in Embodiment one of the present disclosure.

The adjustment scheme of mode two is mainly aimed at non-omnidirectional antenna with an adjustable radiation angle in the communication device. For example, if the communication device determines an interfered antenna as the antenna to be adjusted based on the performance parameters in combination with the coordinate position of each antenna in the antenna sequence group, and determines that the interference source is a directional interference source, in the process of adjusting the antenna to be adjusted, the communication device may first determine a direction of the directional interference source 60 with respect to the antennas to be adjusted (NR-1, NR-2, NR-3, and NR-4), and then adjust a feed contact of the antenna to be adjusted until the radiation direction of the antenna to be adjusted is kept away from a direction where the directional interference source is positioned. After the adjustment, the radiation direction of each antenna and the direction where the directional interference source 60 is positioned are shown in FIG. 6.

AT S208, the communication device controls the operation of an adjusted antenna sequence group.

After adjusting the antenna to be adjusted in the antenna sequence group, the communication device actually completes the adjustment of the antenna sequence group. In the subsequent process, the communication device may control the adjusted antenna sequence group to carry out RF transceiving. It is to be understood that, as compared with the antenna sequence group before adjustment, the adjusted antenna sequence group may only have the radiation angles of some antenna changed, or some antenna members changed, or the antenna members of the whole antenna sequence group changed.

The antenna anti-interference method provided by this embodiment may be executed periodically or aperiodically, to ensure that the communication device can adjust the antennas according to scene requirements, use environment conditions, the direction of the base station antenna, etc. In this way, the orthogonality between the antennas in the antenna sequence group is improved, the anti-interference ability of the antennas is enhanced, the throughput performance of the communication device is improved, and the user experience is enhanced.

Embodiment Two

Due to a limited space for antenna layout on communication device, especially mobile terminals, there is a certain degree of interference and mutual coupling among the antennas. How to eliminate the interference and reduce the mutual coupling, how to arrange more antennas in the limited space, and how to ensure certain isolation between the antennas are key issues in this field.

Taking a mobile phone as an example, according to a traditional antenna arrangement scheme, antennas are generally arranged in an upper, a lower, a left and a right clearance area of the mobile phone. However, with the increase in the number of the antennas, the isolation of some antennas may no longer meet the requirements. Dense deployment of the antennas leads to insufficient distance between the antennas, and interaction between the antennas may produce energy coupling. This strong coupling will reduce the efficiency of the antennas, increase correlation of antenna channels of the MIMO antennas, and thus lead to a decrease of the total throughput.

However, even if two antennas are closer, if the two antennas are orthogonal to each other, the isolation can be enhanced, such that more antennas can be arranged per unit area. The isolation is one of the key parameters of the antennas. The greater the isolation is, the smaller coupling energy between the antennas (for example the LTE antennas and the NR antennas, and the MIMO antennas corresponding to NR) is, and the better the antenna performance is.

In this embodiment, the antennas on the communication device are arranged in a three-dimensional layout. For example, assuming that the communication device is a mobile terminal, an x axis is parallel to a width direction of a display screen of the mobile terminal, a y axis is parallel to a length direction of the display screen of the mobile terminal, and a z axis is perpendicular to the display screen of the mobile terminal. Taking antennas in an N79 frequency band as an example, there are four NR antennas in a traditional 5G mobile terminal, and a plurality of miniaturized and independent N79 antennas are newly added. These newly added N79 antennas are orthogonally distributed with respect to other antennas on the mobile terminal, and may be positioned in gaps around the mobile terminal and on a PCB board, or in gaps on a structural member such as a middle bezel and a rear shell.

The newly added N79 antennas may be ceramic antennas, microstrip antennas or other microarray antennas, as long as it is ensured that there are no metal decorative parts or electroplated parts around the antenna and on the rear shell. In addition, the newly added N79 antennas may also be printed inverted-F antennas (PIFA antennas), flexible printed circuit (FPC) antennas or metal antennas. If the newly added N79 antennas are polarized antennas such as microstrip antennas or dipole antennas, etc., the isolation requirements thereof for physical space is not high, so more antennas can be arranged in per unit area. If the newly added N79 antennas are microstrip antennas, they have low requirements for the clearance area, and are suitable to be deployed in spare directions of various current full-screen terminals.

Figure 7:
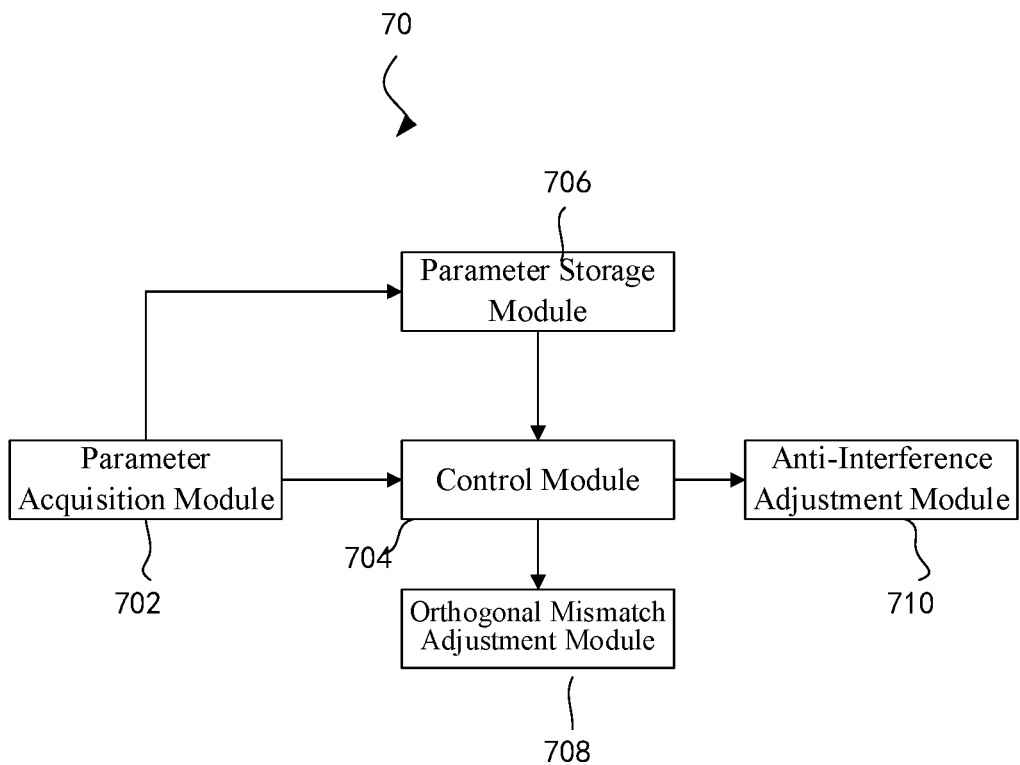
FIG. 7 is a schematic diagram of a communication device provided in Embodiment two of the present disclosure.

Referring to FIG. 7, the communication device 70 includes a parameter acquisition module 702, a control module 704, a parameter storage module 706, an orthogonal mismatch adjustment module 708, and an anti-interference adjustment module 710.

The parameter acquisition module 702 is configured to acquire the performance parameters of each antenna, and the acquired performance parameters may be direct parameters, for example, a signal strength under each antenna path, such as an RSRP value or an RSSI value, or may be efficiency and gain, a directivity, a standing wave ratio, a correlation coefficient or isolation, etc., of each antenna. The performance parameters may also be indirect parameters, such as an SNR value, a CQI value, an MIMO Rank signal flow number, an MCS modulation mode and order, a throughput rate, a bit error rate, etc. The acquired values of the antenna performance parameters may be acquired in real time by a LOG collector built into the communication device 70, where the LOG collector captures each reported value and associates each reported value with an antenna or a combination of antennas in the antenna sequence group.

The parameter storage module 706 is configured to store coordinate position of each antenna. For non-omnidirectional antennas, the parameter storage module 706 may also be configured to store the radiation angle of each antenna. Assuming that the antennas, denoted as A1, A2, . . . , and An, are arranged orthogonally in 3D, and the coordinate positions of the n antennas A1, A2, . . . and An are represented by Y1, Y2, . . . , and Yn, respectively.

The control module 704 is configured to determine, according to the acquired performance parameters in cooperation with the parameter storage module 706, which antennas are problematic, which antennas are unbalanced, and which groups of antennas are not orthogonal to each other and thus cause a degradation effect. The control module 704 may perform calculation of the antenna directivity and interference angle. In the process of 5G communication, there are generally four NR antennas operating, for example, A1, A2, A3 and A4, or A1, A3, A7, and A8. A radio frequency front-end circuit and each antenna are switched by means of switches. Simultaneously, each combination of antennas may also be combined, matched or reorganized through algorithms or according to a simulation result. For example, if a base station to which the terminal faces is at 45 degrees towards east of North, the optimum combination of antenna coordinate positions for N41 corresponding to this direction is Y1, Y3, Y7, and Y8. The communication device 70 may select, according to a calculation result, antennas of this combination of coordinate positions for NR transmission and reception. If the environment changes, the communication device 70 may fine-tune branch antennas in each combination of antennas in real time according to a detection result of the performance parameters of each antenna, or recalculate and select a combination of other antenna angles until an optimal communication state is reached.

In addition, by adding a carrier or modulated signal of a certain signal strength to the communication device 70, for example, a signal strength level RXref of −60, −70, −80, −90, −100, and −110. the parameter acquisition module 702 can acquire received signal levels RX0, RX1, RX2 . . . , and RXn returned by each antenna path, and then the control module 704 compares the acquired value with the initial value RXref, and determines whether there is interference according to a differential RXdif. Because the antennas are arranged according to the coordinate positions of Y1, Y2 . . . and Yn, interfered antennas can reflect interference directions.

The control module 704 determines, based on a detection result of the parameter acquisition module 702, a relative position (Bx, By) of the base station with respect to the communication device 70, and simultaneously detects a relative position such as (Ix, Iy) of the interference source such as an interference electronic device, an interference component and an interference antenna. By detecting direction angles at positions corresponding to the performance parameters, the signal strength and wireless performance parameters of each antenna, the orthogonality between the antennas on the communication device 70 and between the antennas of the communication device 70 and the antennas of the base station is determined, influences of the interference sources on each antenna of the communication device 70 are determined, and relative orientations of the interference sources are determined.

The orthogonal mismatch adjustment module 708 is connected to the control module 704 and is configured to adjust the antennas in the antenna sequence group after the control module 704 determines an antenna orthogonal mismatch. The orthogonal mismatch adjustment is mainly implemented by adjusting antenna arrays and combination thereof.

Signals from the communication device 70 are transmitted from the antennas, and are subjected to spatial multipath attenuation, refraction and reflection to finally reach the base station. If polarization is strong enough, the signals in different polarization directions will be independent of each other, thus reducing the BER of uploading and downloading. That is, on the communication device 70, if polarization modes of one or more groups of antennas are orthogonal to each other, even if the antennas are close to each other, their related interference and coupling will be greatly reduced or eliminated. Correspondingly, by adjusting and selecting antennas A1, A2, A3 and A4 having better orthogonality on the communication device 70 to receive several groups of polarized signals independent of each other transmitted by the base station, polarized signals with small interference and irrelevant attenuation characteristics can be obtained.

If the interaction between the communication device 70 and the base station has a high BER, and the high BER is related to the antennas, the control module 704 calculates whether four antennas currently selected by the communication device 70 are orthogonal to each other, and whether the antennas are orthogonal to the base station antennas. If no, the adjustment is initiated until an ideal orthogonal angle and an ideal bit error coefficient and a throughput value are obtained. If the original antenna sequence group in the N41 frequency band includes the four antennas A1, A2, A3 and A4, but there is a high BER between the antenna sequence group and the base station, and the high BER is due to the fact that the antenna A4 is not orthogonal to the base station antenna, the orthogonal mismatch adjustment module 708 can determine, based on calculation, that four antennas A1, A2, A3 and A7 are orthogonal to the base station antenna, and the four antennas A1, A2, A3 and A7 also satisfy an orthogonal relationship, such that the orthogonal mismatch adjustment module 708 can perform an antenna selection switching operation.

For a plurality of NR MIMO antennas of the communication device 70, such as the four antennas A1, A2, A3 and A4, the control module 704 detects that there is mutual influence, i.e., mutual coupling or interference, among the four antennas by means of the parameter acquisition module 702, or that the LTE antenna L1 has an interference with the antennas A1, A2, A3 and A4 in the ENDC, the anti-interference adjustment module 710 is required to make corresponding anti-interference adjustment.

The anti-interference adjustment module 710 is also connected to the control module 704, and may be configured to perform antenna anti-interference adjustment, which may be achieved by adjusting antenna arrays and a combination thereof, or may be achieved by adjusting feed points of the antennas.

For example, the polarized antennas are arranged at vacant positions on the communication device 70, and an adjustment circuit for ground feeding and signal feeding, such as a low-voltage or high-voltage tuning switch, a resistive-capacitive tuning chip, an MEMES tuning chip, and the like, are additionally provided at a corresponding position of each antenna. Alternatively, a plurality of single-pole single-throw switch feed contact circuits may be additionally provided at a corresponding position of each antenna, for example, switches SPST1, SPST2, . . . SPSTn, and contacts ABCDEF. By changing the positions of the feed points, a radiation pattern of each antenna can also change. Through array combination control and adjustment, the isolation, antenna efficiency, SNR and Envelope Correlation Coefficient (ECC) of the NR antennas are increased to a threshold.

In addition, the anti-interference adjustment module 710 also considers interference influences of a user's body part (such as the head and hands) on the antenna performance, interference influences of different holding postures of the user on the antenna performance (such as landscape holding influence and portrait holding influence), interference influences of relative positions of the base station and the communication device 70 on the antenna performance, and interference influences of other electronic devices on the antenna performance, etc.

According to the antenna control scheme provided by this embodiment, the anti-interference design problem of the MIMO antennas in the existing 5G communication device is solved. Aiming at problems of poor antenna signal, poor directivity, non-orthogonality, poor correlation and easy interference of the 5G communication device, the antennas are adjusted and controlled according to scenario requirements and use environment conditions, which improves the anti-interference ability and isolation of each antenna, and enhances the throughput performance of the communication device.

Embodiment Three

This embodiment provides a communication device, which includes a plurality of antennas arranged in a three-dimensional layout in the communication device. It is to be understood that although there are a plurality of antennas in an existing communication devices, the plurality of antennas arranged in a two-dimensional layout and are distributed on a plane parallel to a display screen of the communication device. However, in this embodiment, a part of the plurality of antennas are arranged on a first plane parallel to the display screen of the communication device, and the other part of the plurality of antennas are arranged on a second plane parallel to the display screen, where the first plane is different from the second plane.

In some examples, a part of the plurality of antennas of the communication device are disposed on at least one of a main board or a daughter board, and the other part of the plurality of antennas may be disposed on a rear shell of the communication device; or a part of the plurality of antennas are provided on at least one of the main board or the daughter board, and the other part of the plurality of antennas are provided on a bezel of the communication device. For example, in the schematic diagram of a layout of the antennas in the communication device shown in FIG. 3, a first NR orthogonal antenna 311, a second NR orthogonal antenna 312, a third NR orthogonal antenna 313, a fourth NR orthogonal antenna 314, a fifth NR orthogonal antenna 315 and a sixth NR orthogonal antenna 316 are provided on the main board 31 of the communication device. A seventh NR orthogonal antenna 321, an eighth NR orthogonal antenna 322 and a ninth NR orthogonal antenna 323 are provided on the daughter board 32 of the communication device. In addition, some antennas are arranged on a clearance area of the rear shell and the surrounding bezels, such as an NR antenna sequence group A (NR-A1, NR-A2, NR-A3 and NR-A4), an NR antenna sequence group B (NR-B1, NR-B2, NR-B3 and NR-B4), a first LTE antenna 301, a second LTE antenna 302, and a WiFi GPS antenna 303.

The communication device provided by this embodiment further includes a memory, storing three-dimensional coordinate positions of the antennas. The communication device can determine position distribution of the antennas according to the three-dimensional coordinate positions of the antennas, and can also determine a relative position relationship between the antennas according to the three-dimensional coordinate positions of different antennas. For example, when antenna control is performed according to the antenna anti-interference method provided in the foregoing examples, the communication device may select an antenna with orthogonality satisfying the requirements to replace the antenna to be adjusted according to the three-dimensional coordinate positions of the antennas.

This embodiment further provides a storage medium, which includes a volatile or non-volatile, removable or non-removable medium implemented in any method or technique for storing information (such as computer-readable instructions, data structures, computer program modules, or other data). The storage medium includes, but not limited to, a Random Access Memory (RAM), a Read-Only Memory (ROM), an Electrically Erasable Programmable Read-Only Memory (EEPROM), a flash memory or other memory technologies, a Compact Disc Read-Only Memory (CD-ROM), a digital versatile disk (DVD) or other optical disk storage, a magnetic cartridge, a magnetic tape, a magnetic disk storage or other magnetic storage devices, or any other medium that may be configured to store desired information and may be accessed by a computer.

The storage medium may store one or more computer programs that may be read, compiled and executed by one or more processors. In this embodiment, the storage medium may store an antenna anti-interference program which, when executed by one or more processors, causes the one or more processors to implement any of the antenna anti-interference methods described in the preceding embodiments.

Figure 8:
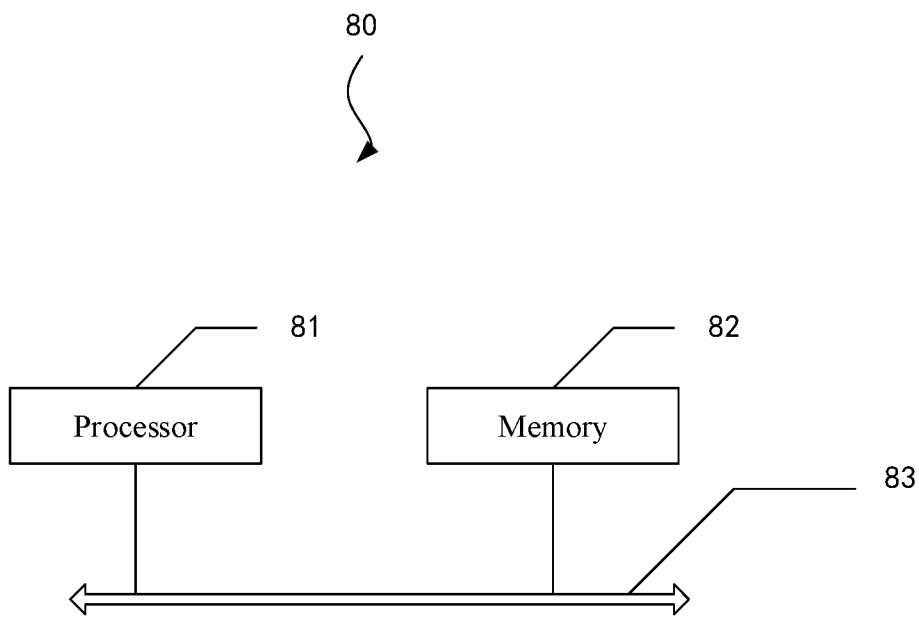
FIG. 8 is a schematic diagram of a hardware structure of a communication device provided in Embodiment three of the present disclosure.

This embodiment further provides a computer program product including a computer-readable device on which the computer program as shown above is stored. The computer-readable device in this embodiment may include a computer-readable storage medium as shown above. For example, the computer program product includes a communication device. As shown in FIG. 8, the communication device 80 includes a processor 81, a memory 82, and a communication bus 83 arranged to connect the processor 81 and the memory 82. Moreover, the communication device 80 further includes a plurality of antennas (not shown in FIG. 8). The memory 82 may be the aforementioned storage medium in which the antenna anti-interference program is stored. The processor 81 may read, compile and execute the antenna anti-interference program, to implement the antenna anti-interference method described in the preceding embodiments.

The processor 81 detects performance parameters of a single antenna and a combination of antennas in an antenna sequence group of the communication device. The antenna sequence group comprises a group of antennas simultaneously operating in different antenna roles, and if any one of the antennas or the antenna roles is different, the corresponding antenna sequence group is different. Subsequently, the processor 81 determines an antenna to be adjusted from the antenna sequence group according to the performance parameters, then adjusts the antenna to be adjusted, and controls operation of an adjusted antenna sequence group.

In some examples, the performance parameters include at least one of a Reference Signal Received Power (RSRP), a Received Signal Strength Indicator (RSSI), an antenna efficiency, an antenna gain, an antenna direction parameter, an antenna standing wave ratio parameter, an antenna isolation, a Signal-to-Noise Ratio (SNR), a Channel Quality Indicator (CQI), a throughput value, a bit error rate, a Modulation and Coding Scheme (MCS), or Rank flow number.

In some examples of this embodiment, the processor 81 may determine that the performance parameters corresponding to the antenna sequence group do not meet the service requirements of the communication device before determining the antenna to be adjusted from the antenna sequence group according to the performance parameters.

In some examples of this embodiment, when adjusting the antenna to be adjusted, the processor 81 may determine an alternative antenna for the antenna to be adjusted, and switch a radio frequency transceiving path originally communicated with the antenna to be adjusted to be communicated with the alternative antenna.

In some other examples of this embodiment, a radiation angle of the antenna to be adjusted is adjusted.

In some examples, when determining the alternative antenna for the antenna to be adjusted, the processor 81 may determines, based on at least one of the performance parameters or the coordinate position of each antenna on the communication device, the alternative antenna for the antenna to be adjusted.

In some examples of this embodiment, the processor 81 determines the antenna to be adjusted from the antenna sequence group according to the performance parameters in at least one of the following ways:

determining an antenna with orthogonality not meeting a requirement from the antenna sequence group as the antenna to be adjusted according to the performance parameter;

determining an interfered antenna as the antenna to be adjusted according to the performance parameters and the coordinate position of each antenna in the antenna sequence group; or determining an antenna causing interference to other antennas in the antenna sequence group as the antenna to be adjusted according to the performance parameters and the coordinate position of each antenna in the antenna sequence group.

In some examples, when determining an antenna with orthogonality not meeting the requirement from the antenna sequence group as the antenna to be adjusted according to the performance parameters, the processor 81 may determine an antenna orthogonally mismatched with other antennas in the antenna sequence group as the antenna to be adjusted according to the performance parameters and the coordinate position of each antenna in the antenna sequence group, or determine, from the antenna sequence group, an antenna orthogonally mismatched with a base station antenna as the antenna to be adjusted according to the performance parameters.

After determining an interfered antenna as the antenna to be adjusted according to the performance parameters and the coordinate position of each antenna in the antenna sequence group, if the interference source is a directional interference source, the processor 81 may first determine a direction of the directional interference source with respect to the antenna to be adjusted when adjusting the antenna to be adjusted, and then adjust a feed contact of the antenna to be adjusted until the radiation direction of the antenna to be adjusted is kept away from a direction where the directional interference source is positioned.

In some examples of this embodiment, the communication device 80 may be any one of a terminal or a Customer Premise Equipment (CPE), where the terminal may be a mobile phone, a tablet computer, a wearable device, or a notebook computer, etc.

In some examples of this embodiment, all the plurality of antennas of the communication device 80 are positioned in the clearance areas, the rear shell or the like of the communication device. In some examples of this embodiment, some of the plurality of antennas of the communication device 80 may be positioned on at least one of the main board or the daughter board of the communication device 80. In these examples, the antennas may be arranged in a three-dimensional layout, and the three-dimensional coordinate positions of the antennas of the communication device are also stored in the memory 82.

Details of executing the antenna anti-interference program by the processor 81 to implement the antenna anti-interference method may refer to the introduction to the foregoing embodiments, and will not be repeated herein.

In the antenna anti-interference method, the communication device and the storage medium provided according to the embodiments of the present disclosure, the communication device includes a plurality of antennas, some or all of which may operate in different antenna roles simultaneously, thereby forming one antenna sequence group, and a change of the antenna or a change in the role of the antenna in the antenna sequence group will cause the antenna sequence group to change. During the operation of the antenna sequence group, the communication device may detect the performance parameters of a single antenna and a combination of antennas in the antenna sequence group, and then determine, according to the performance parameters, an antenna to be adjusted from the antenna sequence group, and adjust the antenna to be adjusted, and then control an adjusted antenna sequence group to operate. By detecting the performance parameters of the single antenna and the combination of the antennas in the antenna sequence group, the communication device can determine an antenna from the antenna sequence group that affects the overall performance of the antenna sequence group as the antenna to be adjusted for adjustment, thereby avoiding as much as possible or even completely eliminating the adverse impacts of the antenna to be adjusted on the overall performance of the antenna sequence group. In this way, the antenna efficiency and the communication quality of the communication device are improved, the throughput of the communication device is improved, and the user experience is enhanced.

It will be apparent to those having ordinary skills in the art that all or some of the steps in the above disclosed methods, systems, or functional modules/units in the above device may be implemented as software (which may be implemented with computer program code executable by a computing device), firmware, hardware, and appropriate combinations thereof. In a hardware implementation, the division between functional modules/units mentioned in the above description does not necessarily correspond to the division of physical components. For example, one physical component may have multiple functions, or one function or step may be jointly performed by a plurality of physical components. Some or all the physical components may be implemented as software executed by a processor such as a central processing unit, a digital signal processor or a microprocessor, or may be implemented as hardware or an integrated circuit such as an application specific integrated circuit.

Furthermore, as well known to those having ordinary skills in the art, communication media typically include computer-readable instructions, data structures, computer program modules or other data in a modulated data signal such as a carrier wave or other transport mechanism, and may include any information delivery media. Therefore, the present disclosure is not limited to the combination of any specific hardware and software.

The above is a further detailed description of the embodiments of the present disclosure in conjunction with some implementations, and the specific embodiments of the present disclosure are not limited thereto. For those having ordinary skills in the art of the present disclosure, some simple derivations or substitutions may be made without departing from the inventive concept of the present disclosure, and shall be regarded as falling within the scope of protection of the present disclosure.

What is claimed is:

1. An antenna anti-interference method, comprising:
   detecting performance parameters of a single antenna and a combination of antennas in an antenna sequence group of a communication device, wherein the antenna sequence group comprises a group of antennas simultaneously operating in different antenna roles, and corresponding antenna sequence groups are different in response to any one of the antennas or the antenna roles being different;
   determining, according to the performance parameters, an antenna to be adjusted from the antenna sequence group;
   adjusting the antenna to be adjusted to reduce interference on the antenna sequence group; and
   controlling operation of an adjusted antenna sequence group;
   wherein determining, according to the performance parameters, an antenna to be adjusted from the antenna sequence group comprises:
   determining an antenna with orthogonality not meeting a requirement from the antenna sequence group as the antenna to be adjusted according to the performance parameter, comprising:
      determining an antenna orthogonally mismatched with other antennas in the antenna sequence group as the antenna to be adjusted according to the performance parameters and the coordinate position of each antenna in the antenna sequence group; and/or
      determining, from the antenna sequence group, an antenna orthogonally mismatched with a base station antenna as the antenna to be adjusted according to the performance parameters.

2. The antenna anti-interference method of claim 1, wherein the performance parameters comprise at least one of a Reference Signal Received Power (RSRP), a Received Signal Strength Indicator (RSSI), antenna efficiency, an antenna gain, an antenna direction parameter, an antenna standing wave ratio parameter, an antenna isolation, a Signal-to-Noise Ratio (SNR), a Channel Quality Indicator (CQI), a throughput value, a bit error rate, a Modulation and Coding Scheme (MCS), or Rank flow number.

3. The antenna anti-interference method of claim 1, wherein prior to determining, according to the performance parameters, an antenna to be adjusted from the antenna sequence group, the antenna anti-interference method further comprises:
   determining that the performance parameters corresponding to the antenna sequence group do not meet a service requirement of the communication device.

4. The antenna anti-interference method of claim 1, wherein adjusting the antenna to be adjusted comprises:
   determining an alternative antenna for the antenna to be adjusted, and switching a radio frequency transceiving path originally communicated with the antenna to be adjusted to be communicated with the alternative antenna; or,
   adjusting a radiation angle of the antenna to be adjusted.

5. The antenna anti-interference method of claim 4, wherein determining an alternative antenna for the antenna to be adjusted comprises:
   determining the alternative antenna for the antenna to be adjusted based on at least one of the performance parameters or a coordinate position of each antenna on the communication device.

6. The antenna anti-interference method of claim 1, wherein determining, according to the performance parameters, an antenna to be adjusted from the antenna sequence group further comprises: determining an interfered antenna as the antenna to be adjusted according to the performance parameters and the coordinate position of each antenna in the antenna sequence group, wherein after determining an interfered antenna as the antenna to be adjusted according to the performance parameters and the coordinate position of each antenna in the antenna sequence group, adjusting the antenna to be adjusted comprises:
   in response to an interference source being a directional interference source, determining a direction of the directional interference source with respect to the antenna to be adjusted; and
   adjusting a feed contact of the antenna to be adjusted until a radiation direction of the antenna to be adjusted is kept away from a direction where the directional interference source is positioned.

7. A non-transitory computer-readable storage medium, storing at least one of antenna anti-interference programs which, when executed by one or more processors, causes the one or more processors to perform the antenna anti-interference method of claim 1.

8. A communication device comprising a processor, a memory, and a communication bus, wherein the communication device further comprises a plurality of antennas;
   the communication bus is configured to implement connection communication between the processor and the memory; and
   the processor is configured to execute one or more programs stored in the memory to perform an antenna anti-interference method, the antenna anti-interference method comprising:
   detecting performance parameters of a single antenna and a combination of antennas in an antenna sequence group of a communication device, wherein the antenna sequence group comprises a group of antennas simultaneously operating in different antenna roles, and corresponding antenna sequence groups are different in response to any one of the antennas or the antenna roles being different;
   determining, according to the performance parameters, an antenna to be adjusted from the antenna sequence group;
   adjusting the antenna to be adjusted to reduce interference on the antenna sequence group; and
   controlling operation of an adjusted antenna sequence group;
   wherein determining, according to the performance parameters, an antenna to be adjusted from the antenna sequence group comprises:
   determining an antenna with orthogonality not meeting a requirement from the antenna sequence group as the antenna to be adjusted according to the performance parameter, comprising:
      determining an antenna orthogonally mismatched with other antennas in the antenna sequence group as the antenna to be adjusted according to the performance parameters and the coordinate position of each antenna in the antenna sequence group; and/or
      determining, from the antenna sequence group, an antenna orthogonally mismatched with a base station antenna as the antenna to be adjusted according to the performance parameters.

9. The communication device of claim 8, wherein a part of the plurality of antennas are positioned on a main board and/or a daughter board of the communication device.

10. The communication device of claim 8, wherein the memory stores a three-dimensional coordinate position of each of the antennas on the communication device.

* * * * *